United States Patent
Ji et al.

(10) Patent No.: US 6,420,647 B1
(45) Date of Patent: Jul. 16, 2002

(54) TEXTURING OF GLASS BY SIO₂ FILM

(75) Inventors: Jing Jia Ji; Zhengrong Shi, both of New South Wales (AU)

(73) Assignee: Pacific Solar Pty Limited, New South Wales (AU)

( * ) Notice: Subject to any disclaimer, the term of this patent is extended or adjusted under 35 U.S.C. 154(b) by 0 days.

(21) Appl. No.: 09/831,234

(22) PCT Filed: Nov. 8, 1999

(86) PCT No.: PCT/AU99/00980

§ 371 (c)(1),
(2), (4) Date: May 31, 2001

(87) PCT Pub. No.: WO00/28603

PCT Pub. Date: May 18, 2000

(30) Foreign Application Priority Data

Nov. 6, 1998 (AU) .............................................. PP 6997

(51) Int. Cl.⁷ ..................... H01L 31/0236; H01L 31/06; H01L 31/18
(52) U.S. Cl. ...................... 136/259; 136/256; 136/261; 136/258; 136/246; 257/434; 257/436; 257/437; 257/461; 257/464; 257/432; 438/96; 438/97; 438/64; 438/65; 438/74; 438/72
(58) Field of Search ................................ 136/256, 261, 136/258, 259, 246; 257/434, 436, 437, 461, 464, 432; 438/96, 97, 64, 65, 71, 72

(56) References Cited

U.S. PATENT DOCUMENTS

| | | | |
|---|---|---|---|
| 3,653,970 A | * | 4/1972 | Iles .............................. 136/256 |
| 4,675,468 A | | 6/1987 | Basol et al. |
| 4,694,116 A | | 9/1987 | Hayashi et al. |
| 4,719,501 A | | 1/1988 | Nakagawa |
| 4,732,621 A | | 3/1988 | Murata et al. |
| 4,904,526 A | * | 2/1990 | Koskenmaki ................ 428/328 |
| 5,482,570 A | * | 1/1996 | Saurer et al. ................ 136/255 |

FOREIGN PATENT DOCUMENTS

| | | |
|---|---|---|
| EP | 0137291 | 4/1985 |
| JP | 10-283847 A | * 10/1998 |
| JP | 2001-177130 A | * 6/2001 |
| WO | WO88/09265 | 12/1988 |

* cited by examiner

Primary Examiner—Alan Diamond
(74) Attorney, Agent, or Firm—Jordan and Hamburg LLP

(57) ABSTRACT

A thin film silicon solar cell is provided on a glass substrate, is illustrated, the glass having a textured surface, including larger scale surface features and smaller scale surface features. Over the surface is deposited a thin barrier layer which also serves as an anti-reflection coating. The barrier layer may be a silicon nitride layer for example and will be 70 nm ±20% in order to best achieve its anti-reflection function. Over the barrier layer is formed an essentially conformal silicon film having a thickness which is less than the dimensions of the larger scale features of the glass surface and of a similar dimension to the smaller scale features of the glass surface.

58 Claims, 4 Drawing Sheets

TEXTURING OF GLASS BY SIO₂ FILM

INTRODUCTION

The present invention relates generally to thin film photovoltaic devices and in particular the invention provides a structure and a method of forming the structure for thin film cells to achieve light trapping in these cells.

BACKGROUND OF THE INVENTION

The use of light trapping is well know in monocrystalline silicon cells where light trapping features in the surface of the cell have dimensions which are much less than the thickness of silicon substrate of the device and significantly greater than the wavelength of light in air.

In solar cells, light scattering is used to trap light in the active region of the cell. The more light that is trapped in the cell, the higher the photocurent that can be generated which leads to higher efficiency. Therefore, light trapping is an important issue when trying to improve efficiency in solar cells and is particularly important in thin film cell design.

However it has been widely thought that in thin film devices where the active silicon layers are thin films formed over a substrate such as glass, light trapping would not be possible or at least demonstrate reduced effectiveness. This is because the film thicknesses are of the same order of magnitude or thinner than the dimension of light trapping features in known monocrystalline devices. As film thicknesses in thin film devices are reduced, they tend toward conformal coatings having predominantly parallel surfaces over the etched surface of the glass substrate and conventional thinking would be that such an arrangement does not achieve significant advantages from light trapping. Also as film thicknesses are reduced to the order of a wavelength (in air) or thinner conventional thinking is that the mechanisms providing light trapping in prior art devices would cease to be effective.

This is born out in prior art thin film amorphous silicon solar cell devices where no deliberate attempt at texturing was made. Present day amorphous silicon devices typically comprise a glass superstrate over which is layed a Transparent Conductive Oxide (TCO) contact layer and a thin amorphous silicon film (1 μm) active layer including a p-n junction and a rear metallic layer acting as a reflector and back contact. When such structures were first devised it was noticed that in some circumstances (when the surface of the TCO was cloudy) cell performance was greater than expected but the literature offered no explanation as to the reason for such unexpected performance.

It has now become apparent to the present inventors that light trapping is possible in thin film devices and the prior art amorphous silicon devices were in fact demonstrating a characteristic that the present inventors have now identified and adapted to crystalline silicon thin film cells. Central to the invention is the realisation that the wavelength of light of a given frequency is different in silicon and air.

The present inventors have now identified the circumstances under which light trapping can be achieved in thin films and in particular the inventors have devised methods for manufacture of thin film crystalline silicon solar cell structures which exhibit light trapping characteristics.

The methods of achieving light trapping devised by the present inventors generally involve texturing a surface of the substrate on which the thin film is formed. Conventionally, glass textures are made by chemical texturing and sand blasting. Recently, metal crystal deposits have been used on a substrate surface to form very fine crystals to produce texture effect.

However, both chemical texturing and sand blasting cause cracks and non-uniform feature size on the glass surface, each of which can adversely affect solar cell fabrication and/or performance, such as by causing shunting in the devices. It is assumed that it is for this reason that there are apparently no reports of high efficient solar cell fabrication being achieved on either chemical textured or sandblasted substrates. Furthermore, the method used to perform the chemical texturing also produces waste products that are environmentally hazardous and therefore represent a severe pollution risk. On the other hand, the use of fine metal crystals to form a textured surface is an expensive approach and significantly adds to the cost of solar cells manufactured using this technique.

SUMMARY OF THE INVENTION

According to a first aspect, the present invention provides a method of forming a light trapping structure in a thin film silicon solar cell formed on a glass substrate or superstrate, the method including the steps of:
  a) providing a textured surface on the glass substrate or superstrate, the texturing layer comprising texturing particles held in a binding matrix; and
  b) forming a silicon film on the textured surface and forming a photovoltaic device structure in the silicon film, the silicon film being less than 10 μm thick.

According to a second aspect, the present invention provides a thin film photovoltaic device incorporating a light trapping structure, wherein the photovoltaic device is formed on a textured surface provided on a glass substrate or superstrate, the photovoltaic device comprising a thin silicon film into which is formed at least one pn photovoltaic junction, the silicon film being less than 10 μm thick and the textured surface being provided by a texturing layer over a surface of the substrate or superstrate and comprising texturing particles held in a binding matrix.

The invention is applicable to both crystalline and amorphous silicon solar cells. In the case of amorphous silicon cells, a thin silicon film is formed over a TCO layer, or alternatively the texturing film containing the texturing particles may itself be of TCO material.

In embodiments of the invention, the texturing layer preferably includes surface features having dimensions in a range from 0.5–0.2 times the thickness of the silicon film.

The silicon film is typically less than 5 μm thick and preferably has a thickness of 2 μm or less. The silicon film is typically at least 0.5 μm or greater and preferably greater than 1 μm. Typically, the scale of textured surface features is in the range of 0.01–10 μm. The useful lower limit of the feature size is in the order of a wavelength of light in crystalline silicon and typically the useful lower limit is 0.05 μm. The texturing may also include large scale features which have dimensions greater than the thickness of the silicon film.

In one set of embodiments, a textured layer is applied to the glass surface by mixing crushed quartz having particle dimensions in the order of 0.5–3 μm and preferably in the order of 1–2 μm into a glass sol, applying the mixture to the glass surface and heating to sinter the glass sol to form a dielectric layer. Note that the final feature dimension of the surface in this case includes quite small features, being determined largely by the surface roughness of the crushed quartz and the thickness of the dielectric layer, as well as the particle size of the quartz.

In preferred embodiments of the invention, the texturing of the substrate or superstrate is achieved by an SiO₂ layer which includes monospheric SiO₂ particles in the range of 0.1–2 μm in diameter. Preferably, the monospherical particles are in the range of 0.5–0.91 μm and in a particularly preferred embodiment, the particles are approximately 0.7 μm (eg, 0.65–0.75 μm). The particles are located in a smooth SiO₂ film having a thickness in the range of 0.2–0.8 times the diameter of the monospheric particles. Preferably, the SiO₂ layer is in the range of 0.35–0.5 times the particle diameter and in the particularly preferred embodiment, is approximately 0.3 μm (eg, 0.25–0.35 μm). The difference between particle dimension and film thickness results in a textured surface, however in this case the features can be more greatly spaced as they are larger. Both the SiO₂ particles and the film are made by a Sol-Gel process.

The SiO₂ layer also provides a barrier layer between the glass substrate and the silicon film. A separate barrier layer may also act as an anti-reflection layer and will be arranged to have a thickness equal to a quarter wavelength ± 20% which in the case of silicon nitride is 70 nm ±20%.

In typical embodiments of the invention the back surface of the silicon film structure (ie, remote from the glass) has a reflective material formed over it. Typically, the reflective material will be a metallisation structure used to contact the active regions of the cell. The metallisation structure will in some embodiments, be separated from most of the silicon back surface by an insulating layer.

BRIEF DESCRIPTIONS OF THE DRAWINGS

Embodiments of the invention will now be described by way of example, with reference to the accompanying drawings in which:

FIGS. 1 & 2 schematically illustrate two stages in the formation of a first embodiment of the invention in which a textured layer is applied to the substrate;

FIGS. 3, 4 & 5 schematically illustrate three stages in the formation of a second embodiment of the invention in which a different textured layer is applied to the substrate;

DETAILED DESCRIPTION OF EMBODIMENTS OF THE INVENTION

Figure 1:
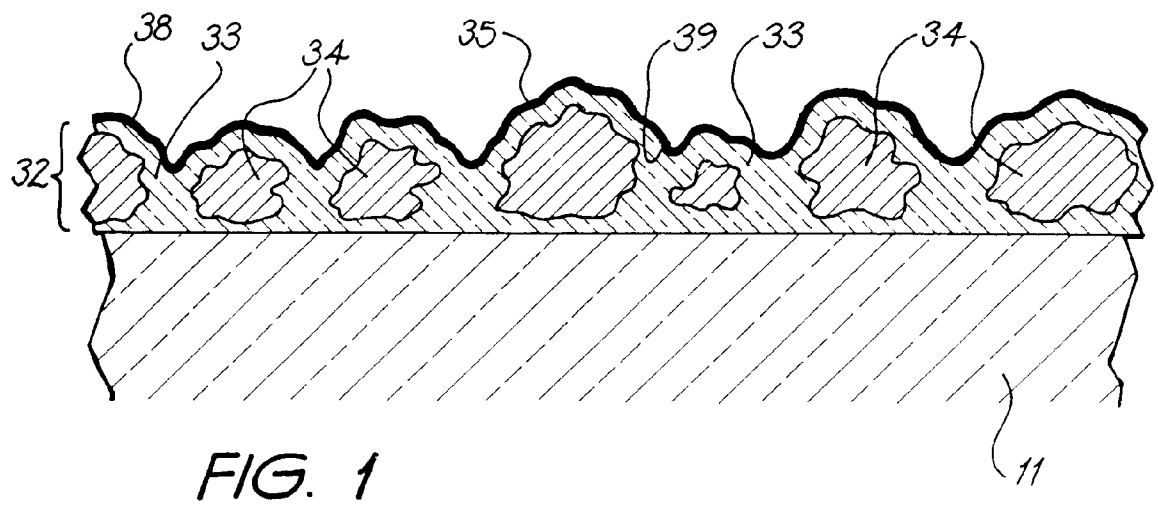

A thin film silicon solar cell is formed on a glass substrate 11 which has a texturing layer 32 applied comprising an SiO₂ film 33 mixed with texturing particles 34 having diameters in the order of 1–2 μm whereby a textured surface 39 is formed. The SiO₂ film is thinner than the average diameter of the texturing particles such that the quartz projects through the spin-on glass.

Figure 2:
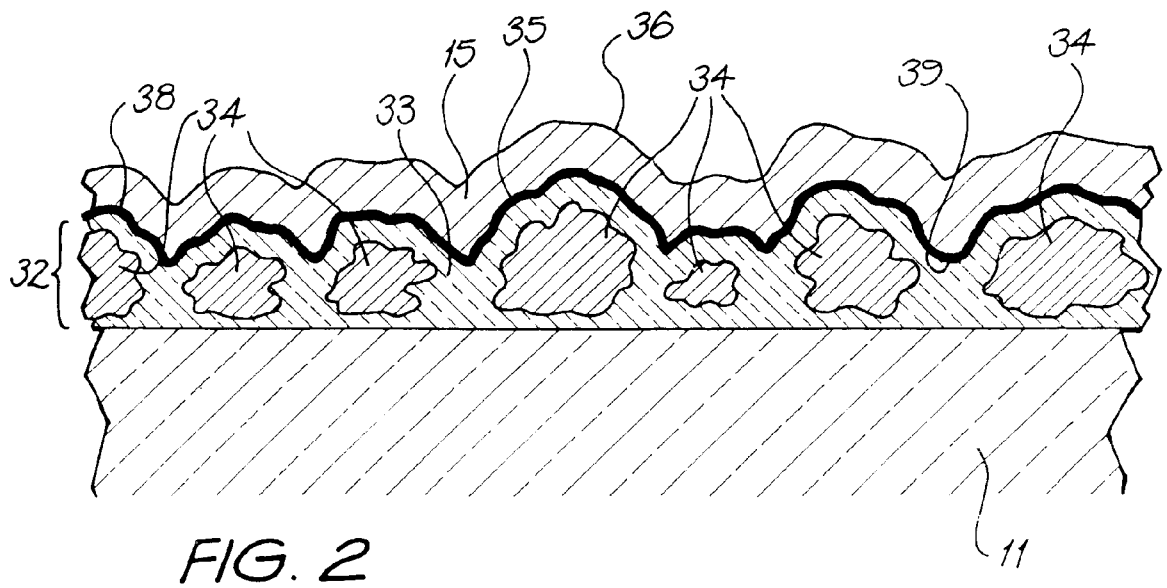

The dielectric layer in this case provides a barrier layer function, however, a separate anti-reflection coating 38 may optionally be employed, having an upper surface 35 which is conformal with the textured surface 39. As illustrated in FIG. 2, a silicon film 15 is then formed over the textured surface 35 of the anti-reflection coating 38. The silicon film has a thickness preferably in the range of 0.5–2 μm (ie, of similar thickness to the dimensions of the texture features provided on the surface of the SiO₂ layer). Although the silicon film produced by this method loosely conforms to the textured surface over which it is formed, the opposite surfaces of the film are substantially non-parallel, at least on a small scale such that light will generally traverse the silicon film at an angle to the silicon surface.

More importantly, the light will more often than not strike the rear surface of the silicon film (upper surface, in FIGS. 1 and 2) at a significant angle to the normal to the surface 36, such that for a significant number of incidences, total internal reflection will occur. The surface 36 may also be coated with a reflective material 39 (such as a rear metal contact) to assist in reflecting internal light striking this surface.

Figure 3:
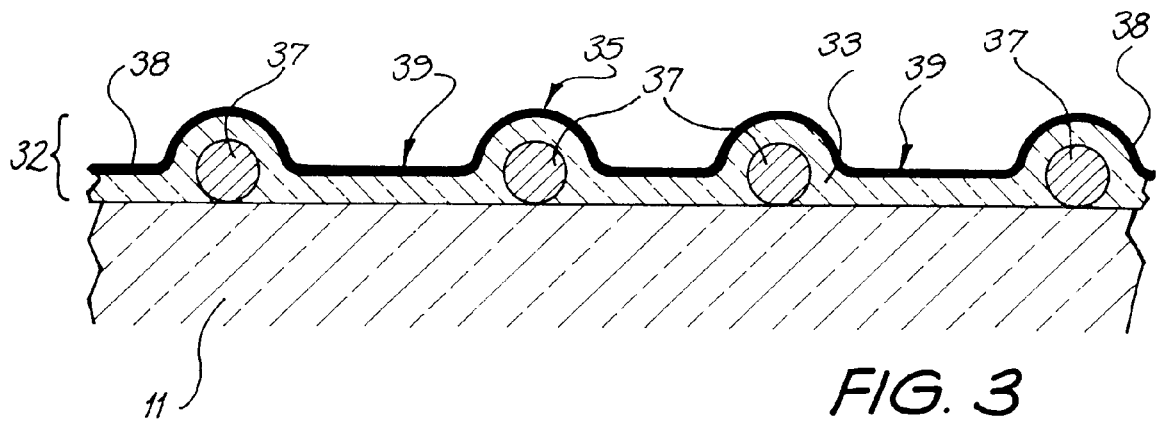
Figure 4:
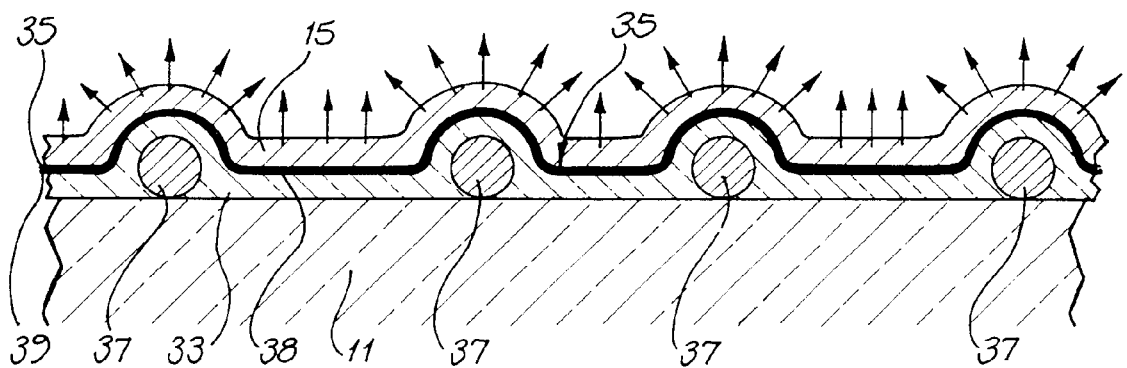
Figure 5:
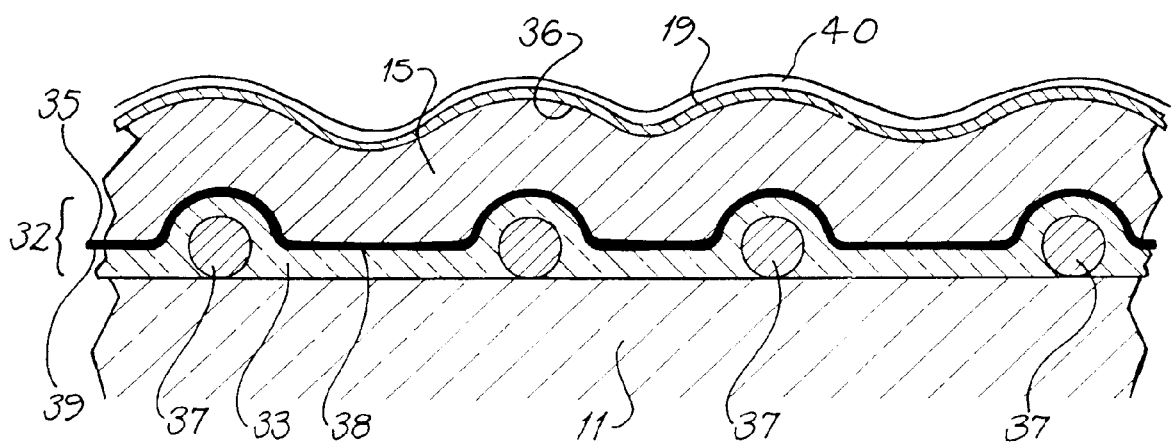
Figure 6:
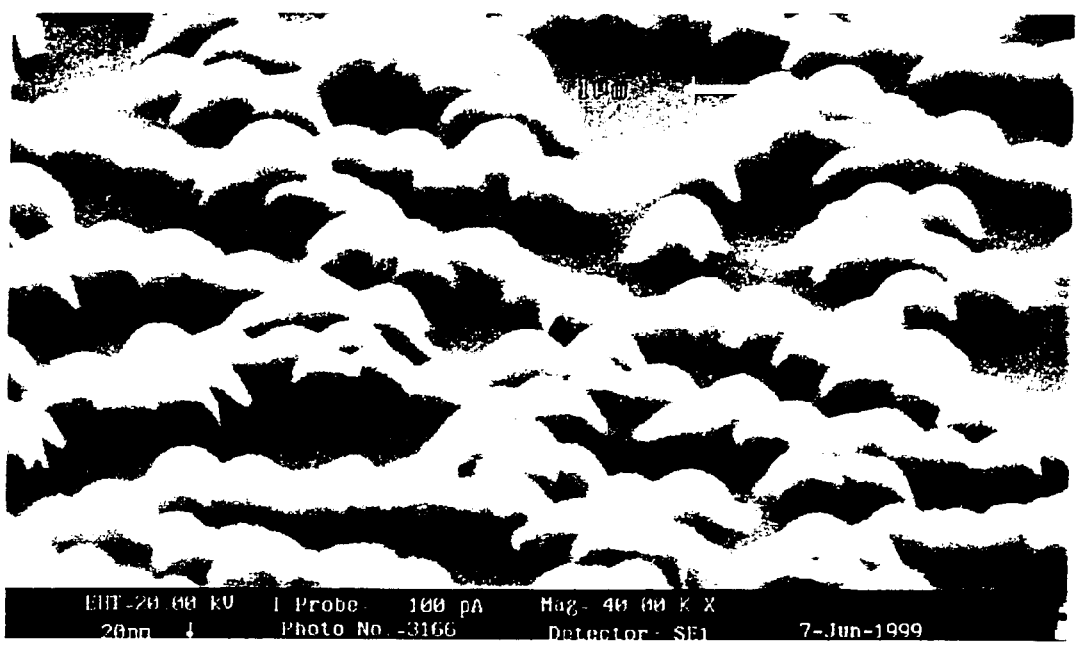
FIG. 6 is a perspective view of a textured surface in accordance with the method described with reference to FIGS. 3, 4 & 5.
Figure 7:
FIG. 7 is a photograph of a section through a device manufactured by the method described with reference to FIGS. 3, 4 & 5.

Referring to FIGS. 3, 4 and 5, another embodiment is illustrated in which a layer 32 of SiO₂ 33 is applied to the surface of the substrate 11, the SiO₂ layer 32 including SiO₂ monospheres 37 which result in a textured surface of the spin-on layer.

The steps for forming the embodiment of FIGS. 3, 4 and 5, include forming an SiO₂ Sol by the Sol-Gel process, in which monosphere particles of SiO₂ are formed in the SiO₂ sol during its preparation and the SiO₂ sol is applied to a substrate or superstrate 11 such that the resulting SiO₂ layer 32 produces a textured surface 39 for thin film solar cell fabrication. An anti-reflective coating 38 having an upper surface 35 may also be applied. In the preferred embodiment, the SiO₂ layer 32 includes monospheric SiO₂ particles 37 of approximate 0.7 μm diameter and a smooth SiO₂ film 32 of approximate 0.3μm thickness which covers the SiO₂ particles 37. The difference between particle dimension and film thickness results in a textured surface. However, particles in the range from 0.5–2 μm can be used with SiO₂ film thicknesses in the range 0.2–0.8 times the monosphere diameter.

Referring to FIG. 4, when a silicon film 15 is in the process of being deposited over the textured surface 35 of the barrier layer 38, using a formation method such as Plasma Enhanced Chemical Vapour Deposition (PECVD), the film will grow simultaneously from all points on the surface at a substantially constant rate in a direction normal to the surface at the respective points. This results in a film similar to that shown in FIG. 5, where small relatively sparse texturing features on the surface of the substrate (ie, on surface 35) result in larger features which merge into one another on the opposite surface 36 of the silicon film. This results in significant non-parallelism between the surfaces of the silicon film and produces good light trapping when the film is illuminated through the substrate. Note also that this approach is useful for amorphous silicon devices, and crystalline silicon devices both when the crystalline structure is formed directly and when the crystalline structure is formed by crystallising amorphous silicon (eg; by solid phase crystallisation).

Finally, after the silicon has been formed and any processing required to be performed over the entire silicon layer has been completed, such as the formation of a dielectric layer 19, a metal layer 40 is applied over the silicon surface 36 to provide a back reflector and to be processed into contacts for contacting to the semiconductor device formed in the silicon film. The dielectric layer 19 is located between the silicon 15 and the metal layer 40 in order to isolate the metal from the upper region of the semiconductor film such that portions of the metal can be connected through to the lower region of the semiconductor film without shorting the junction.

Both the SiO$_2$ particles 37 and film 32 in which they are applied, are made by a Sol-Gel process. The Sol-Gel process involves mixing a metal organic compound with water acting as a hydrolysis agent and alcohol as the solvent. The metal organic compound reacts with water in the solution to form a metal oxide polymer. Sizes of the polymer particles depend on the pH value of the solution. The solution after reaction is called a Sol. The sol transits to a Gel when the solvent evaporates. Further sintering makes the Gel become a rigid metal oxide (ie, an SiO$_2$ dielectric layer).

The Sol-Gel process has certain advantages, such as high purity, well-controlled concentration and simple formation. These advantages determine that the process has wide applications. For example, the Sol-Gel process known as Spin-On Glass (SOG) has been used in the semiconductor industry for years. However, usually it would not be desirable to produce a gel which contained particles of any significant size, as in the present case.

Among metal oxides formed by the Sol-Gel process, SiO$_2$ sol has been applied in various industries. In the semiconductor industry, SiO$_2$ layers formed by this process have been used to form a dielectric layer and a planarisation layer. It can also be used to form a doping source if dopant is added into the SiO$_2$ sol. The SiO$_2$ film has also been used as an anti-reflection layer, barrier layer, strengthening layer, chemical resistant layer and so on.

As mentioned above, the size of the polymer particles 37 can be adjusted by the pH value of the solution. Generally speaking, as the pH value of the solution is decreased below 7, the particle size decreases to values which can become less than 100 nm. Most Spin-On Glasses behave in this manner. As the pH is increased to values greater than 7, the particle size increases to values which can be more than 1.0 $\mu$m.

This embodiment has significant advantages even over other desirable embodiments of the invention, as follows:
  i) The SiO$_2$ particle can be made monosize and monoshape (spherical). Therefore, together with the SiO$_2$ film, the texture made can be very smooth and uniform in terms of height of the texture features. This feature is important for fabrication of high efficiency thin film solar cells because it reduces any sharp grooves/cracks, and thus reduces shunting problems without further processing of the texturing.
  ii) Instead of creating flaws at the glass surface by chemical texturing or sand blasting, the Sol-Gel texture layer actually fills the flaws so that the glass may be strengthened after texturing;
  iii) The Sol-Gel texture provides an extra barrier layer to impede the migration of impurities from glass to Si film;
  iv) The texture can be subjected to very high temperature (eg, up to Si melting point), without causing damage to the texture features because the texture is made by SiO$_2$ which has a higher melting point than the glass substrate. On the other hand, the chemical texture features may become molten at high temperature, reducing any light trapping effect;
  v) It is an environmentally friendly process. The only potentially roblematic step is the possible release of ethanol to the atmosphere during processing, although it would be a relatively simple matter to recycle the ethanol. Chemical texturing, by comparison will produce vast quantities of HF waste;
  vi) The process of applying the texture layer is not difficult to scale up;
  vii) The process costs less than chemical texturing if the cost of waste treatment is included in the cost of chemical texturing.

The embodiments described above rely upon forming a textured layer over a planar substrate or superstrate, however, it is also possible to perform the invention by directly texturing the substrate or superstrate surface.

Figure 8:
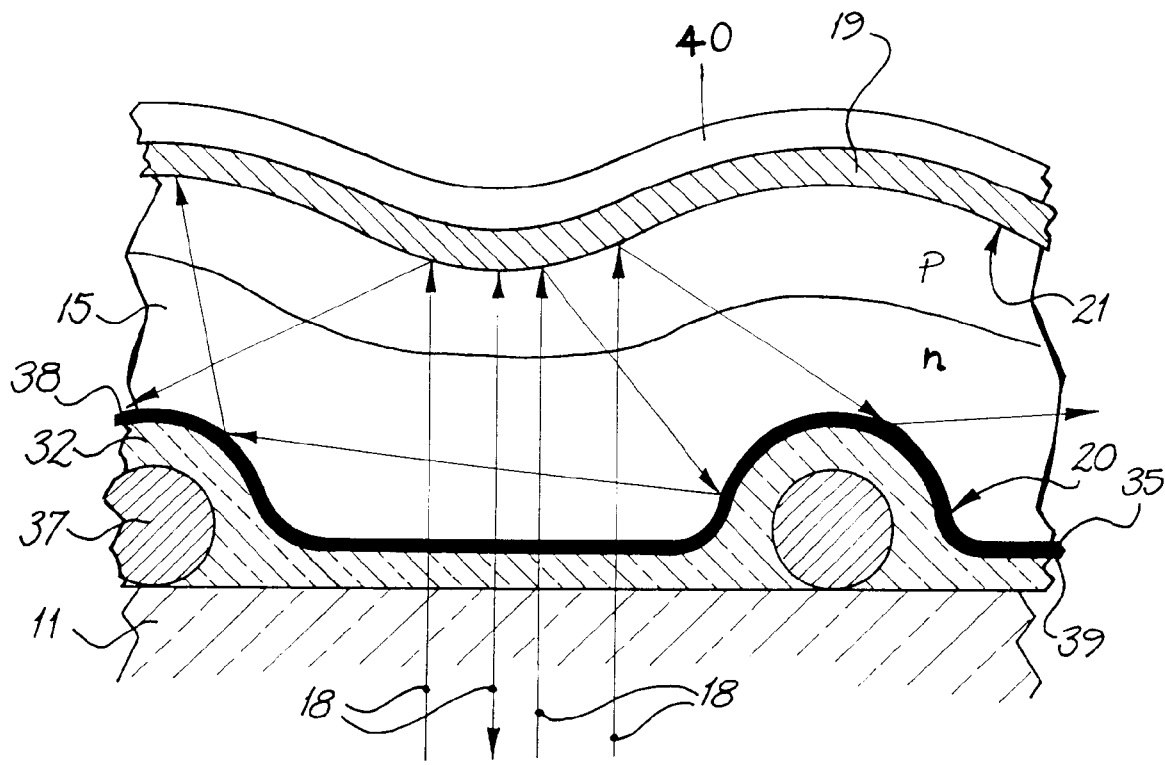
FIG. 8 is a sectional side view of a glass substrate with a textured dielectric (SiO₂) layer and a thin film of silicon formed over its surface, illustrating representative paths of incident photons through the glass substrate, the texturing layer and the silicon layer.

Illustrated in FIG. 8, is a sectional view of an embodiment similar to that of FIGS. 3–5, in which are shown photons of light which enter or exit the silicon film 15 along paths 18 through the substrate and are reflected within the silicon film 15, between the lower dielectric / silicon interface 20 (or anti-reflection layer/silicon interface) and the upper silicon / dielectric interface 21 or the surface of the metal (back contact) 19, several times, thereby increasing the conversion efficiency of a photovoltaic cell formed in the thin silicon film.

The present invention may also be applied to amorphous silicon cells in which case the conventional processing steps for manufacturer of amorphous cells would be amended as follows:
  1) to the surface of a glass substrate or superstrate, apply a texturing layer comprising texturing particles bound in a TCO matrix. The TCO material can be applied by a Sol-Gel process or by deposition using sputtering or other suitable techniques and the texturing particles may be SiO$_2$ beads, crushed quartz or particles of the TCO material itself;
  2) form an amorphous silicon film over the TCO matrix, or alternatively:
  1) to the surface of a glass substrate or superstrate, apply a texturing layer comprising texturing particles bound in an SiO$_2$ matrix, as described with reference to FIGS. 1 to 5 above;
  2) form a TCO film over the SiO$_2$ matrix;
  3) form an amorphous silicon film over the TCO film.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A method of forming a light trapping structure in a thin film silicon solar cell formed on a glass substrate or superstrate, the method including the steps of:
  a) applying a texturing layer to a surface of the glass substrate or superstrate, the texturing layer comprising texturing particles held in a binding matrix; and
  b) forming a silicon film on the textured surface and forming a photovoltaic device structure in the silicon film, the silicon film being less than 10 $\mu$m thick.

2. The method as claimed in claim 1, wherein the thin film silicon device is formed in a crystalline silicon thin film.

3. The method as claimed in claim 1, wherein the thin film silicon device is formed in an amorphous silicon thin film formed on a TCO layer.

4. The method as claimed in claim 1, wherein the textured surface of the texturing layer includes surface features having dimensions in a range from 0.05–0.2 times the thickness of the silicon film.

5. The method as claimed in claim 1, wherein the texturing layer is applied to the surface of the substrate or superstrate by preparing a Sol-Gel glass, containing texturing particles, applying the Sol-Gel glass to the surface of the substrate or superstrate such that the thickness of glass film after it is applied is less than an average diameter of the texturing particles, and heating the Sol-Gel glass to sinter it whereby it becomes a dielectric layer.

6. The method as claimed in claim 1, wherein the texturing layer is applied to the surface of the substrate or superstrate by preparing a Sol-Gel glass containing texturing particles, applying the Sol-Gel glass to the surface of the substrate or superstrate such that the thickness of glass film after it is applied is less than an average diameter of the texturing particles, and heating the Sol-Gel glass to sinter it whereby it becomes a TCO layer and the thin film silicon device is formed in an amorphous silicon thin film formed on the TCO layer.

7. The method as claimed in claim 5, wherein the dielectric layer produced from the Sol-Gel glass layer is an $SiO_2$ layer.

8. The method as claimed in claim 6 or 7, wherein the texturing particles are monospheric $SiO_2$ particles.

9. The method as claimed in claim 8, wherein the $SiO_2$ particles are in the range of 0.2–1.5 μm in diameter.

10. The method as claimed in claim 8, wherein the $SiO_2$ particles are in the range of 0.5–0.9 μm in diameter.

11. The method as claimed in claim 8, wherein the $SiO_2$ particles are in the range of 0.65–0.75 μm in diameter.

12. The method as claimed in claim 7, wherein the texturing particles are crushed quartz.

13. The method as claimed in claim 12, wherein the quartz particles are predominantly in the range of 0.5–3.0 μm in diameter.

14. The method as claimed in claim 12, wherein the quartz particles are predominantly in the range of 1.0–2.0 μm in diameter.

15. The method as claimed in claim 11, wherein the thickness of the binding matrix is in the range of 0.2–0.8 times the average diameter of the texturing particles.

16. The method as claimed in claim 9, wherein the thickness of the binding matrix is in the range of 0.35–0.5 times the average diameter of the texturing particles.

17. The method as claimed in claim 8, wherein the thickness of the binding matrix is in the range of 0.25–0.35 μm and the average diameter of the texturing particles is in the range of 0.65–0.75 μm.

18. The method as claimed in claim 5, wherein after the step of applying the texturing layer has been completed, a thin conformal barrier layer is formed prior to forming the thin silicon film.

19. The method as claimed in claim 18, wherein the barrier layer is applied with a thickness equal to one quarter wavelength of light in the barrier layer material ±20%.

20. The method as claimed in claim 19, wherein the barrier layer material is silicon nitride with a thickness of 70 nm ±20%.

21. The method as claimed in claim 4, wherein the thin silicon film formed over the textured surface has a thickness in the range of 1–10 times the average height of the features of the surface texturing.

22. The method as claimed in claim 4, wherein the thin silicon film formed over the textured surface has a thickness in the range of 2–3 times the average height of the features of the surface texturing.

23. The method as claimed in claim 17, wherein the thin silicon film formed over the textured surface has a thickness in the range of 1–2 μm.

24. The method as claimed in claim 1, wherein after the silicon film is formed, a reflective material layer is formed over a surface of the silicon film remote from the substrate or superstrate.

25. The method as claimed in claim 24, wherein an insulating layer is formed over the surface of the silicon film remote from the substrate or superstrate prior to formation of the reflective material layer.

26. The method as claimed in claim 24, wherein the reflective material layer also forms a metallisation structure to contact the active regions of the cell.

27. The method as claimed in claim 23, wherein after the silicon film is formed, a reflective material layer is formed over a surface of the silicon film remote from the substrate or superstrate.

28. The method as claimed in claim 27, wherein an insulating layer is formed over the surface of the silicon film remote from the substrate or superstrate prior to formation of the reflective material layer.

29. The method as claimed in claim 28, wherein the reflective material layer also forms a metallisation structure to contact the active regions of the cell.

30. A thin film photovoltaic device incorporating a light trapping structure, wherein the photovoltaic device is formed on a textured surface provided on a glass substrate or superstrate, the photovoltaic device comprising a thin silicon film into which is formed at least one pn photovoltaic junction, the silicon film being less than 10 μm thick and the textured surface being provided by a texturing layer located over a surface of the substrate or superstrate and comprising texturing particles held in a binding matrix.

31. The device as claimed in claim 30, wherein the thin silicon film is a crystalline silicon thin film.

32. The device as claimed in claim 30, wherein the thin silicon film is an amorphous silicon thin film formed on a TCO layer.

33. The device as claimed in claim 30, wherein the textured surface of the texturing layer includes surface features having dimensions in a range from 0.05–0.2 times the thickness of the silicon film.

34. The device as claimed in claim 30, wherein the texturing layer is a dielectric layer formed as a hardened Sol-Gel glass containing texturing particles, the Sol-Gel glass having a thickness less than an average diameter of the texturing particles.

35. The device as claimed in claim 30, wherein the texturing layer is a TCO layer formed as a hardened TCO Sol-Gel film containing texturing particles, the Sol-Gel film, having a thickness less than an average diameter of the texturing particles and silicon film is an amorphous silicon thin film formed on the TCO layer.

36. The device as claimed in claim 34, wherein the dielectric layer is an $SiO_2$ layer.

37. The device as claimed in claim 36, wherein the texturing particles are monospheric $SiO_2$ particles.

38. The device as claimed in claim 37, wherein the $SiO_2$ particles are in the range of 0.2–1.5 μm in diameter.

39. The device as claimed in claim 37, wherein the $SiO_2$ particles are in the range of 0.5–0.9 μm in diameter.

40. The device as claimed in claim 37, wherein the $SiO_2$ particles are in the range of 0.65–0.75 μm in diameter.

41. The device as claimed in claim 36, wherein the texturing particles are crushed quartz.

42. The device as claimed in claim 41, wherein the quartz particles are predominantly in the range of 0.5–3 μm in diameter.

43. The device as claimed in claim 41 wherein the quartz particles are predominantly in the range of 1.0–2 μm in diameter.

44. The device as claimed in claim 40, wherein the thickness of the binding matrix is in the range of 0.2–0.8 times the average diameter of the texturing particles.

45. The device as claimed in claim 38, wherein the thickness of the binding matrix is in the range of 0.35–0.5 times the average diameter of the texturing particles.

46. The device as claimed in claim 37, wherein the thickness of the binding matrix is in the range of 0.25–0.35 μm and the average diameter of the texturing particles is in the range of 0.65–0.75 μm.

47. The device as claimed in claim 34, wherein a thin conformal barrier layer is located between the texturing layer and the thin silicon film.

48. The device as claimed in claim 47, wherein the barrier layer has a thickness equal to one quarter wavelength of light in the barrier layer material ±20%.

49. The device as claimed in claim 48, wherein the barrier layer material is silicon nitride with a thickness of 70 nm ±20%.

50. The device as claimed in claim 33, wherein the thin silicon film has a thickness in the range of 1–10 times the average height of the features of the surface texturing.

51. The device as claimed in claim 33, wherein the thin silicon film has a thickness in the range of 2–3 times the average height of the features of the surface texturing.

52. The device as claimed in claim 46, wherein the thin silicon film has a thickness in the range of 1–2 μm.

53. The device as claimed in claim 30, wherein a reflective material layer is located over a surface of the silicon film remote from the substrate or superstrate.

54. The device as claimed in claim 53, wherein an insulating layer is located between the silicon film and the reflective material layer.

55. The device as claimed in claim 53, wherein the reflective material layer also forms a metallisation structure to contact the active regions of the cell.

56. The device as claimed in claim 52, wherein a reflective material layer is located over a surface of the silicon film remote from the substrate or superstrate.

57. The device as claimed in claim 56, wherein an insulating layer is located between the silicon film and the reflective material layer.

58. The device as claimed in claim 56, wherein the reflective material layer also forms a metallisation structure to contact the active regions of the cell.

* * * * *